United States Patent

Grzelakowski

[11] Patent Number: 5,969,356
[45] Date of Patent: Oct. 19, 1999

[54] DOUBLE REFLECTION ELECTRON EMISSION MICROSCOPE

[75] Inventor: Krzystoph Grzelakowski, Hunstetten-Gorsroth, Germany

[73] Assignee: Focus GmbH, Hunstetten-Gorsroth, Germany

[21] Appl. No.: 08/755,781

[22] Filed: Nov. 22, 1996

[30] Foreign Application Priority Data

Nov. 23, 1995 [DE] Germany .......................... 195 43 652

[51] Int. Cl.$^6$ ................................................. H01J 37/147
[52] U.S. Cl. ........................................... 250/310; 250/397
[58] Field of Search .................................... 250/310, 397, 250/306, 311

[56] References Cited

U.S. PATENT DOCUMENTS

| | | |
|---|---|---|
| 3,624,393 | 11/1971 | Torqueblau .............................. 250/397 |
| 3,714,425 | 1/1973 | Someya et al. .......................... 250/310 |
| 4,460,827 | 7/1984 | Onoguchi et al. ....................... 250/306 |
| 4,812,652 | 3/1989 | Egle et al. ............................... 250/311 |
| 4,988,868 | 1/1991 | Gray ......................................... 250/281 |
| 5,061,850 | 10/1991 | Kelly et al. .............................. 250/306 |
| 5,319,207 | 6/1994 | Rose et al. ............................... 250/311 |

*Primary Examiner*—Bruce Anderson
*Attorney, Agent, or Firm*—Kilpatrick Stockton LLP

[57] ABSTRACT

Described is an electron microscope, with which different study modes can be conducted. An electron reflector is mounted in the rear focal plane of the objective lens or in one of its conjugate planes and oriented in such a manner that the primary beam coming from the electron source is focused on the specimen to be studied. The reflector tip can be made of a monocrystal or a polycrystalline material.

20 Claims, 8 Drawing Sheets

DOUBLE REFLECTION ELECTRON EMISSION MICROSCOPE

FIELD OF THE INVENTION

The invention relates to an electron microscope, and more specifically, to an election microscope with an electron source and an electron optical imaging system, including at least one objective and one projector lens, and a detector, which includes a phosphor screen and/or an electron multiplier.

BACKGROUND OF THE INVENTION

In direct imaging electron microscopy, which is unrelated to the scanning method, one distinguishes basically between transmission electron microscopes and electron emission microscopes.

In transmission electron microscopes, the sequence of the modules is analogous to that of the light microscope, where the filament lamp is replaced by the electron source and electromagnetic lenses are used for the imaging system. The imaging takes place on a phosphor screen with a photo device. In a transmission electron microscope, pictures can be obtained by means of electron beam diffraction by simply switching. To this end, the excitation of the intermediate lens, i.e. with respect to the passage of current, is attenuated to such an extent that it can no longer reproduce the one-step enlarged image of the objective lens, but rather the preceding diffraction pattern of the specimen, which is always produced in the rear focal plane of the objective lens. The resulting diffraction pattern permits a number of valuable statements to be made about the structure and orientation of the specimen details.

In the case of electron emission microscopy, on the other hand, the specimen is bombarded from the front by primary electrons from the electron source, or by other exciting particles. Therefore, because of the interactions of the primary electrons with the solid being studied, the results are in addition to elastic scattering of the primary electrons, (also secondary electrons and Auger electrons). The released secondary electrons originate primarily from a thin surface layer of the specimen. The backscattered electrons come from the deeper layers of the specimen.

To sample the primary electrons in electron emission microscopy, two different methods were used in the past, and are described in "Historical Perspective and Current Trends in Emission Microscopy, Mirror Microscopy and Low Energy Electron Microscopy" by O. H. Griffith and W. Engel in *Ultramicroscopy* 36 (1991), pp. 1–28.

One of these methods provides a linear electron-optical system, in which the electron source is mounted behind the detection screen and the primary beam is focused through an aperture in the detection screen onto the specimen. Thus, an electron optical lens is mounted in front of the specimen, in order to align the primary beam in parallel with the optical axis and thus produce parallel illumination of the specimen. In this respect, it is possible to analyze the diffraction pattern (low energy electron diffraction or LEED mode), but the specimen surface cannot be imaged with the elastic electrons (imaging mode or low energy electron reflection microscopy (LEEM) mode), because the reflected ray goes through the aperture in the center of the viewing screen. However, with this microscope, direct imaging of the surface potential with mirror electron microscopy (MEM) is possible. This known linear arrangement is simple in its construction, but the incident beam and the reflected beam cannot be suitably optimized at the same time.

To remedy this problem, a segmented magnetic field has been used in order to be able to separate the incident light and the beam reflected from the specimen. Such an LEEM type electron microscope has been developed by Bauer and Telieps; and an example thereof is described in the above-cited paper in *Ultramicroscopy*, 36 (1991), p. 22. A further improvement of the LEEM electron microscope for analyzing magnetic surface structures would require an electron source which emits spin-polarized electrons, which are separated in a segmented magnetic field without changing the spin-polarization direction of the imaged electrons. Since spin polarization is necessary, one also refers to a SPLEEM or SPLEED microscope (spin polarized low energy electron microscopy), whose drawback lies, however, in the fact that it is extremely complicated and, therefore, expensive.

Whereas both in the LEED or LEEM, and also in the SPLEEM or SPLEED mode, one works with a parallel electron beam striking the specimen surface, it is necessary for imaging secondary and Auger electrons to focus the primary beam on the specimen, in order to raise the electron density in the visual field. Even with this type of electron microscope, however, the primary beam and the beam of the emitted electrons have to be separated by means of a segmented magnetic field.

SUMMARY OF THE INVENTION

Therefore, the object of the present invention is to provide an electron microscope in which the primary beam can be focused in a simple manner on the specimen, and with which different methods of analysis can be conducted without having to take extensive measures to retrofit the device.

This problem is solved with an electron microscope in which an electron reflector is mounted in the rear focal plane of the objective lens, or in one of its conjugate planes, and is oriented in such a manner that the primary beam coming from the electron source is focused on the specimen to be analyzed.

Due to the double reflection of the electron beam at the electron reflector and at the specimen surface, the electron microscope according to the present invention can also be referred to as a double reflection electron microscope (DREEM=double reflection electron emission microscope).

The electron reflector is a simple and inexpensive alternative to a segmented magnetic field, in order to focus the electron beam on the specimen. In contrast to a segmented magnetic field, the electron reflector does not take part in the imaging of the electron beams coming from the specimen, since it is mounted in the region without a field. Even though the electron reflector is preferably mounted with its tip in the beam path of the electron optical imaging system, there is no negative impact on the imaging properties of the double reflection electron microscope. The shading of a small part of the diffraction pattern causes only a slight decrease in the brightness of the image.

In a preferred embodiment, the effective surface of the electron reflector is mounted at a 45° angle $\beta$ to the optical axis of the objective lens. In this orientation of the electron reflector, the electron source, which is located outside the beam path of the electron optical imaging system, is also preferably mounted in the rear focal plane of the objective lens, or one of its conjugate planes. The longitudinal axis of the electron source is in the focal plane or the conjugate plane and forms an angle $\alpha=90°$ with the optical axis of the objective lens. Therefore, the primary beam emitted from the electron source travels essentially in the focal plane or conjugate plane.

Depending on the requirement and choice of the reflector material, however, it may be desirable to arrange the effective surface of the electron reflector not only rigidly at an angle β=45°, but also to allow other angles β. Therefore, the electron reflector is preferably swivel-mounted around the focal point of the objective lens so that a plurality of angels β can be realized. Correspondingly, the electron source must also be swivel-mounted around the focal point of the objective lens. The same applies if the electron reflector and the electron source are mounted in one of the conjugate planes of the objective lens.

The angle β can assume values ranging from 30° to 60° and a swivel angle α can assume values ranging from 60° to 120°.

The movements of both the electron reflector and the electron source are preferably tied to one another, so that the diffraction condition is maintained and the deflected primary beam also strikes the specimen.

To expand the possible applications of the electron microscope according to the invention, at least one lens is preferably mounted between the electron source and the electron reflector. Several lenses and/or deflecting elements may also be provided. The primary electron beam coming from the electron source is focused on the electron reflector both in the LEED mode and also for imaging with elastic electrons. The resulting parallel illumination of the surface of the specimen leads then to the production of an LEED image, (i.e. a diffraction pattern in the rear focal plane of the objective), which can be reproduced on the phosphor screen of the detector by the other components of the electron-optical imaging system.

In switching from the LEED mode to direct imaging of the surface (LEEM mode) by means of the diffracted electrons, only the excitation of the projector lens has to be changed. Usually two projector lenses are used, whereby the excitation of the first projector lens is modified, and then the second projector lens enlarges the intermediate image on the phosphor screen or the electron multiplier.

In imaging with secondary, Auger, or other electrons, the primary beam is focused on the specimen, in order to increase the electron density in the visual field. To facilitate this, the excitation of the lens of the electron source can be varied, so that the focus of the primary electron beam no longer coincides with the focal point of the objective lens, but rather is located in front of the electron reflector, so that a larger surface of the electron reflector is divergently illuminated by the primary beam.

The electron microscope's field of application can be expanded by providing means for scanning the surface of the specimen. There are several options for accomplishing this. Preferably an electrostatic deflector, which changes the primary beam's angle of incidence at the reflector in two directions that are orthogonal to each other, is mounted between the electron source and the reflector. Another possibility is to leave the primary beam unaffected and to pivot the reflector in such a manner by means of an adjusting mechanism that the specimen is scanned. In this embodiment, the beam, reflected at the reflector, is changed in two direction that are orthogonal to each other.

The reflector material or the material of the reflector tip can be chosen as a function of the application purpose. Since secondary electrons are irrelevant when the primary beam is reflected from the effective surface of the electron reflector, only the elastic scattering and reflection and the spin polarization of the electrons have to be considered with the choice of material.

The electron reflector tip can be made of a monocrystalline or a polycrystalline material.

If the device is to be used for imaging magnetic domains, the reflector material should be a material with a high atomic number, in order to exploit the known spin polarization effect when scattered at heavy atoms. As an alternative, a thin ferromagnetic layer can also be used. The vector of the spin polarization P is perpendicular to the scattering plane from the incoming and outgoing beam at the electron reflector.

The magnetic contrast that is produced is caused by the excitation of a spin-polarized electron beam by means of the first scattering process at the electron reflector, and also by generating intensity asymmetries by means of the second scattering process of the spin-polarized beam at the magnetic structure.

Backscattering of the beam at a magnetic specimen, which is spin-polarized by means of the reflector, produces an intensity asymmetry due to exchange scattering. This asymmetry is a function of the relative orientation of the vectors of the spin polarization P and magnetization M. Thus, it is possible to map and display, for example, single bits on a magnetic storage medium.

Polycrystalline layers of precious metals, like gold or platinum, are preferably just as suitable as monocrystals with defined surfaces, such as the non-reconstructed Pt(111) surface. However, monocrystalline surfaces are difficult to produce and handle, because they have to be prepared. Yet they offer the fundamental advantage of significantly higher reflected intensities, because a well-defined, intense mirror beam leaves the reflector. In contrast, polycrystalline materials scatter diffusely into a wide angular area, a feature that has to be accepted when the primary intensity is correspondingly high.

As an alternative, monocrystals made of high melting point materials like tungsten and molybdenum are also quite suitable, since their surfaces can be made chemically pure by heating in an oxygen atmosphere for a short period of time to a temperature of (typically) 2,300 Kelvin. In principle, a very fine monocrystalline tip, which can be made, for example, of tungsten or platinum with an atomically smooth terrace on the front side can also be a suitable reflector. Such tips are used in field emission guns and field ion microscopes and are commercially available.

If the spin polarization effect is not utilized, a wide spectrum of materials is available without limiting the atomic number. Owing to the extremely simple preparation it is preferable to use small monocrystals made of graphite. Natural crystals with high atomic numbers are preferred over pyrolytically produced crystals. Very good alternatives are $LaB_6$ or $CeB_6$ monocrystals preferably in the shape of rods with flat front terraces, since they can be prepared by simply heating. Such rods can be used as electron emitters and are commercially available.

In addition, the electron reflector may include a heater, in order to keep the reflector surface clean from contamination.

The electron reflector can be installed in a holder, therefore making it more easily replaceable. Therefore, when there is a switch from one method of analysis to another, the electron reflector can also be rapidly exchanged in a simple manner. This feature can be further simplified in that there is a rotatable holder fitted with several electron reflectors. In this way, the electron reflectors can be arranged, for example, in a star configuration in the holder, whereby the holder can be rotated in order to change the electron reflectors as desired. Such a revolving configuration is the advantageous in that the electron reflectors can be easily changed without any retrofitting work.

BRIEF DESCRIPTION OF THE DRAWINGS

Exemplary embodiments of the invention are explained in detail in the following with the aid of the drawings appended hereto, wherein.

DETAILED DESCRIPTION OF THE PREFERRED EMBODIMENTS

Figure 1:
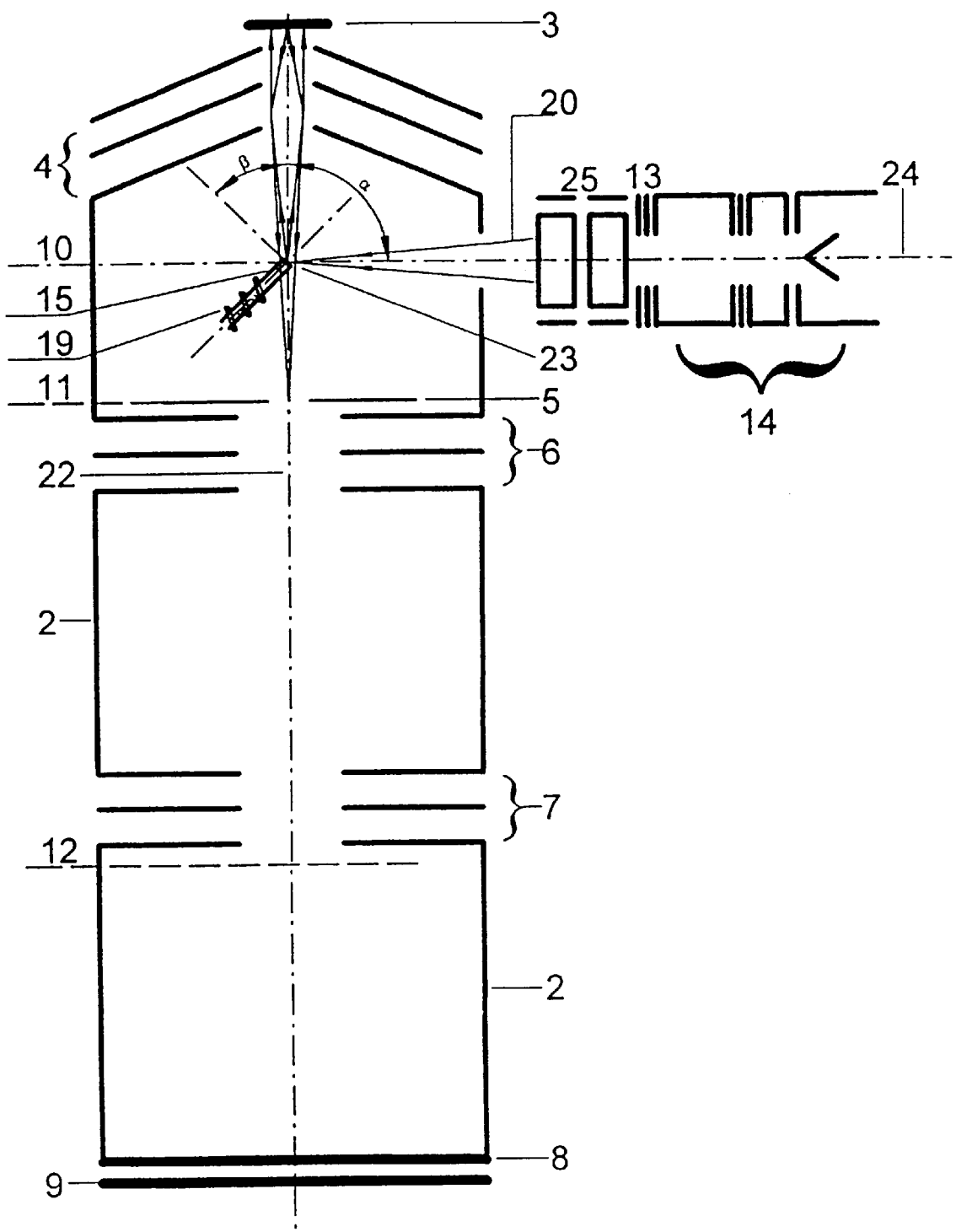
FIG. 1 is a schematic drawing of the electron microscope.

FIG. 1 depicts an electron microscope 1, which has a housing 2 and includes, from the top to the bottom, an objective lens 4, a diaphragm 5 in the image plane 11 of the objective lens 4, a first projector lens 6, (also called the transfer lens), a second projector lens 7, an electron multiplier 8 or multichannel plate, and a phosphor screen 9. The lenses 4, 6, and 7 can be electrostatic or magnetic lenses. Above the objective lens 4 is the specimen 3 being studied. The electron reflector 15, whose effective surface 18 (see FIGS. 2a,b) forms an angle $\beta=45°$ with the optical axis 22 of the objective lens 4, is mounted in the rear focal plane 10 of the objective lens 4.

The tip 16 of the electron reflector 15 projects into the beam path of the objective lens 4 or the entire electron optical imaging system, which comprises lenses 4, 6 and 7. The primary electron beam 20 is delivered by the laterally mounted electron source, which is also mounted here in the focal be plane 10 of the embodiment illustrated here. This means that the longitudinal axis 24 of the electron source 14 and the primary beam 20, coming from the electron source 14, lie in the focal plane 10. The primary beam 20 is reflected at the effective surface 18 of the electron reflector 15 and focused on the specimen 3. As an alternative, the electron reflector 15 and the electron source 14 could also be mounted in one of the conjugate planes (e.g. in the plane 12 depicted in the schematic drawing). However, the lens error can have an adverse effect on the resolution capability. Therefore, it is preferable to choose the configuration shown in FIG. 1.

Both the electron reflector 15 and the electron source 14 can be swivel-mounted around the focal point 23. In so doing, the movements of the electron reflector 15 and the electron source 14 are preferably tied to one another, so that the primary beam correspondingly strikes the specimen 3 even at different angles.

Between the electron source 14 and the electron reflector 15 there is a lens system 13, which can also be electrostatic or magnetic, and a deflecting system 25 (double deflector). Thus, the primary beam 20 is focused on the effective face 18 of the electron reflector 15 at the correct angle of incidence. Then the focal point 23 of the objective lens 4 coincides with the focal point of the lens system 13.

In addition the electron reflector 15 is equipped with a heater, (e.g. in the form of a coil 19).

Figure 2A:
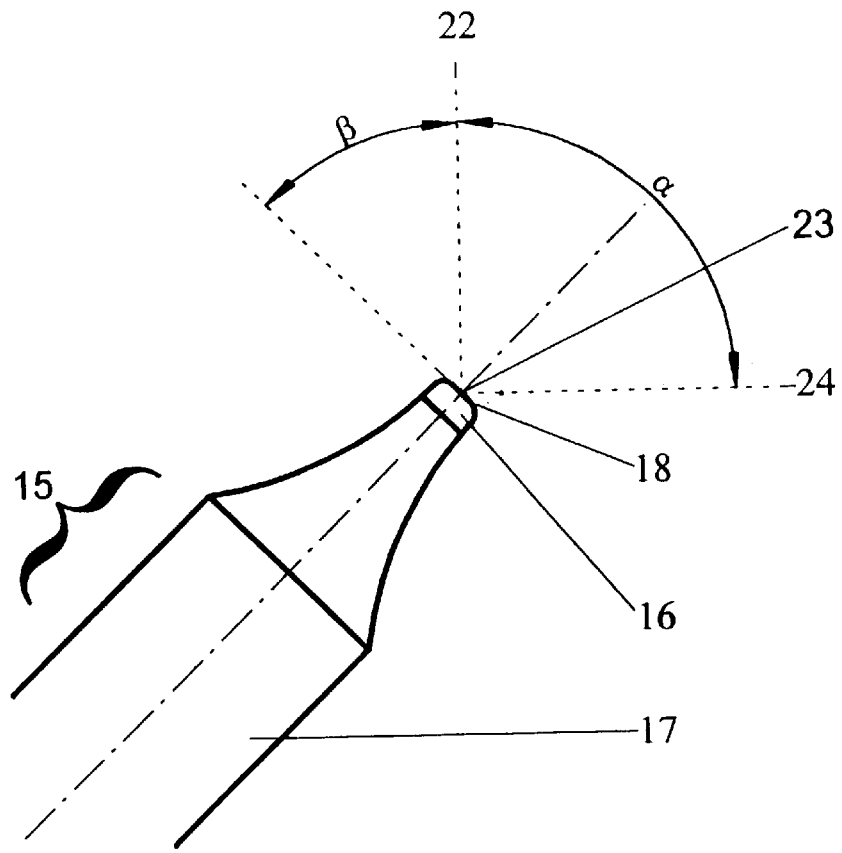
FIGS 2a, b are enlarged drawings of the electron reflector according to two embodiments.
Figure 2B:
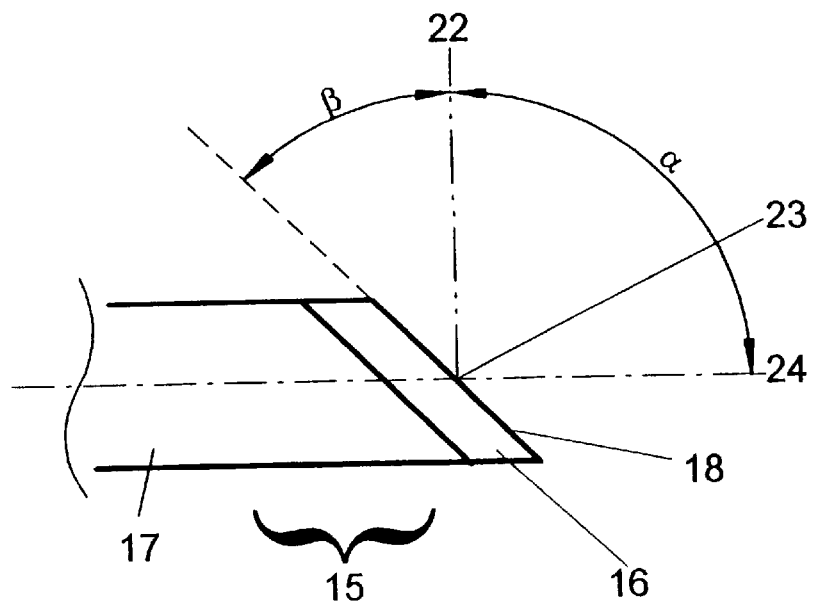

FIGS. 2a and b are enlarged drawings of an electron reflector 15. The electron reflector 15 comprises a substrate 17, made of an arbitrary material, and the tip 16, for which a material that is suitable for the intended operating mode is chosen. In FIG. 2a, the effective surface 18 of the electron reflector 15 is aligned vertically with respect to its longitudinal axis, whereas the electron reflector 15, depicted in FIG. 2b, exhibits a chamfered tip 16.

Figure 3:
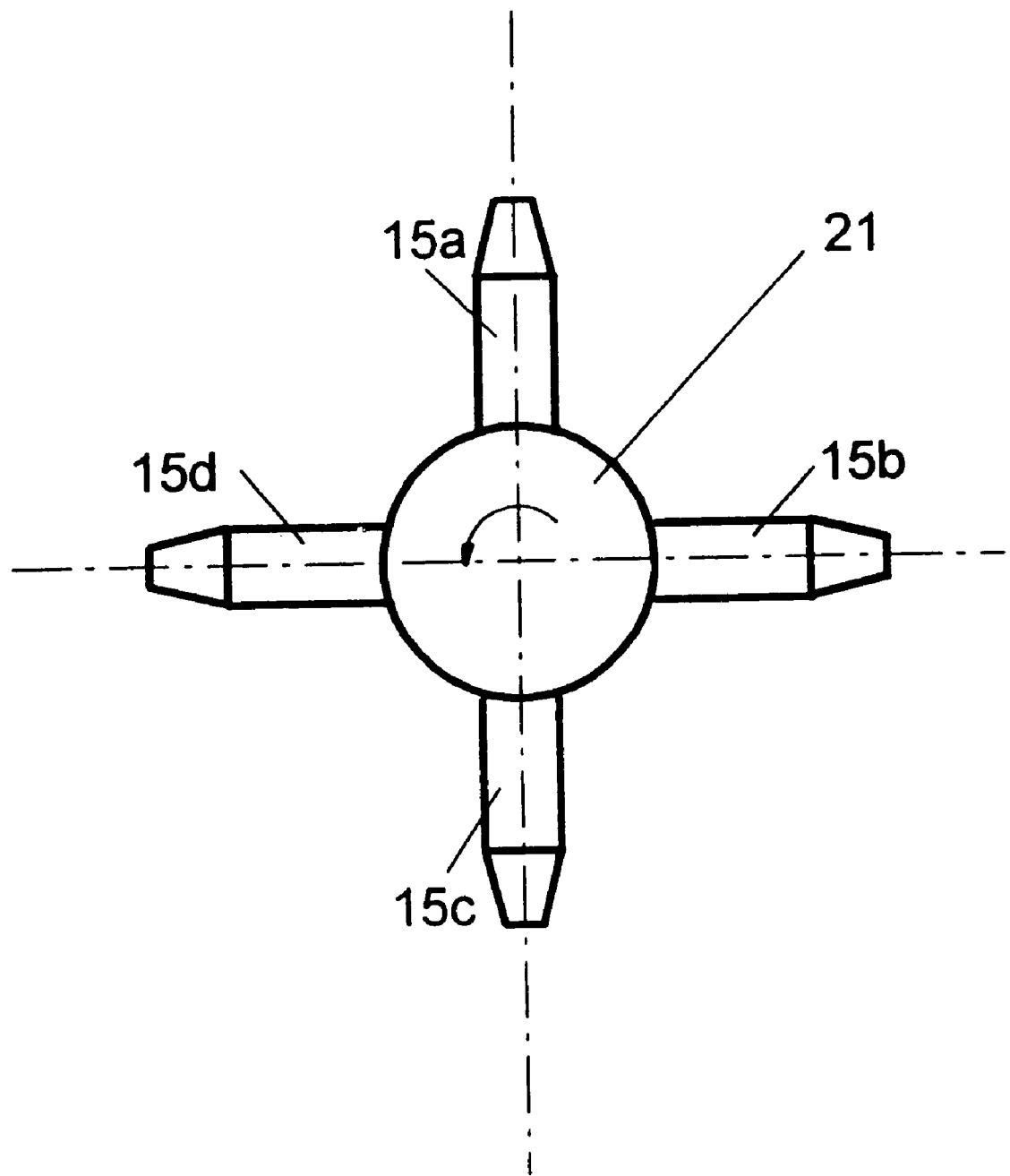
FIG. 3 is a top view of a holder with several electron reflectors.

To enable the interchange of electron reflectors 15 in a simple manner, a total of, for example, four electron reflectors 15a–d can be mounted in a star-shaped configuration on a rotatable holder 21 in FIG. 3.

By rotating the holder 21, a desired electron reflector 15a–d can be moved into the reflecting position.

Figure 4A:
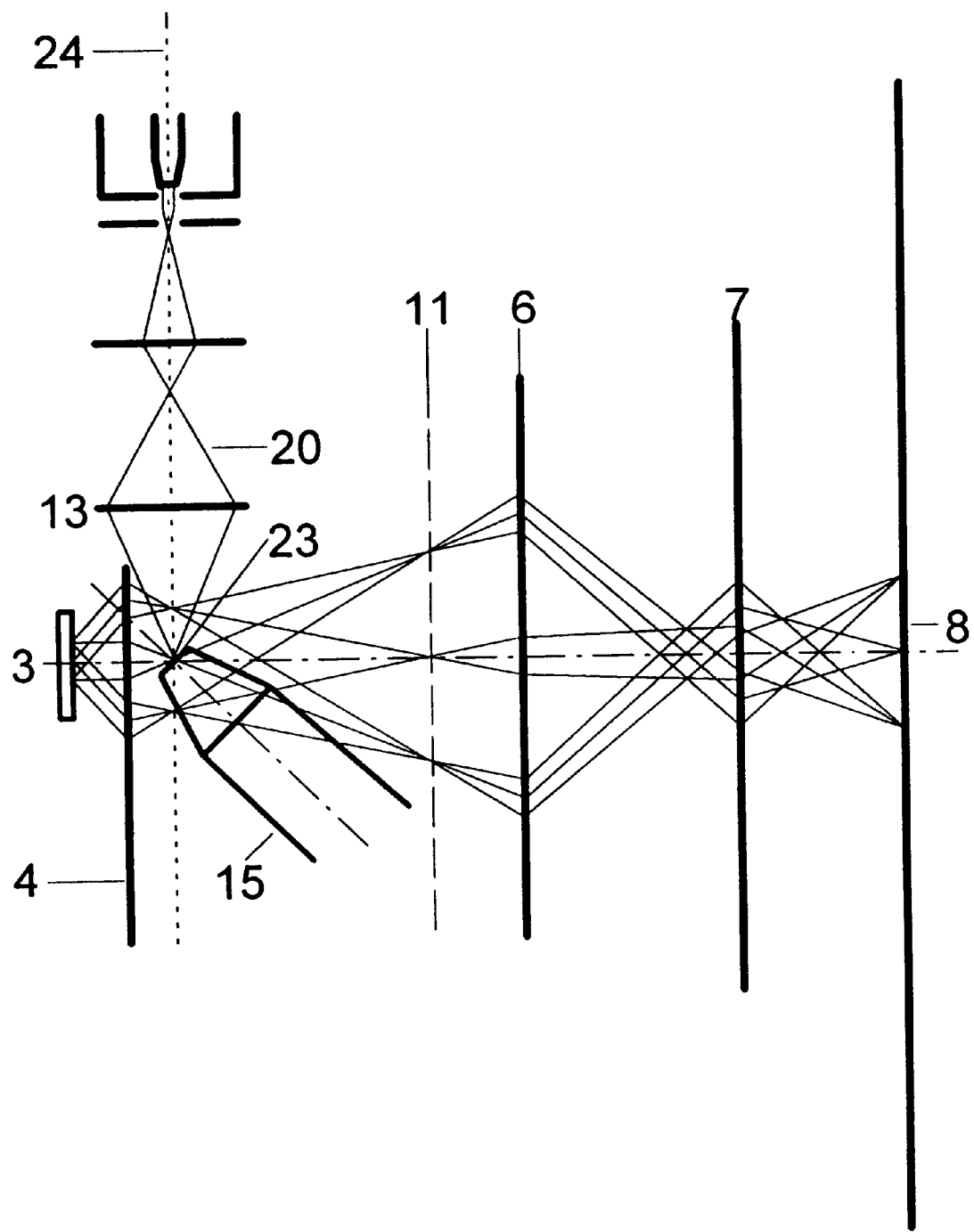
FIGS. 4a–d are schematic drawings of the beam paths in the electron microscope in various operating modes.
Figure 4B:
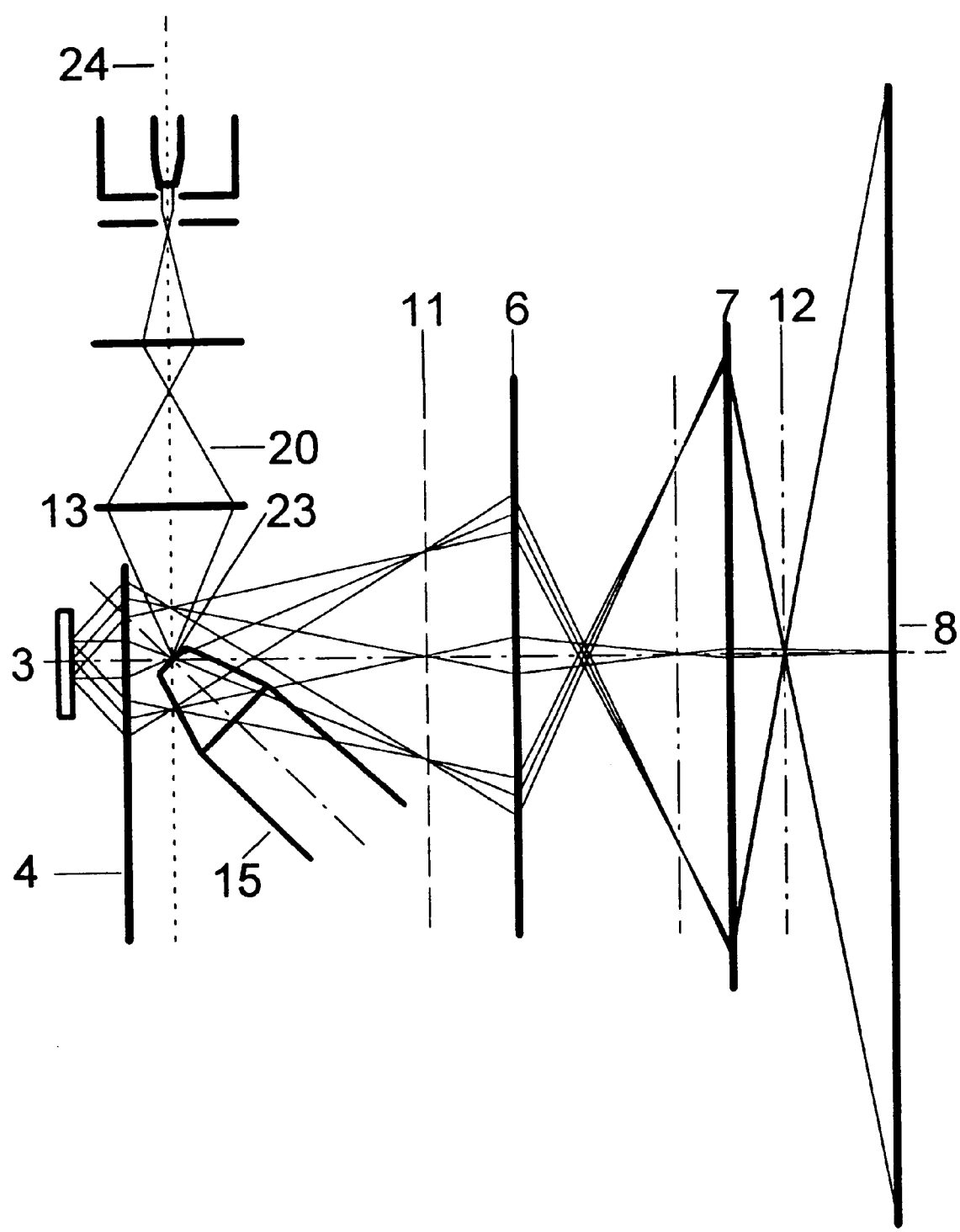
Figure 4C:
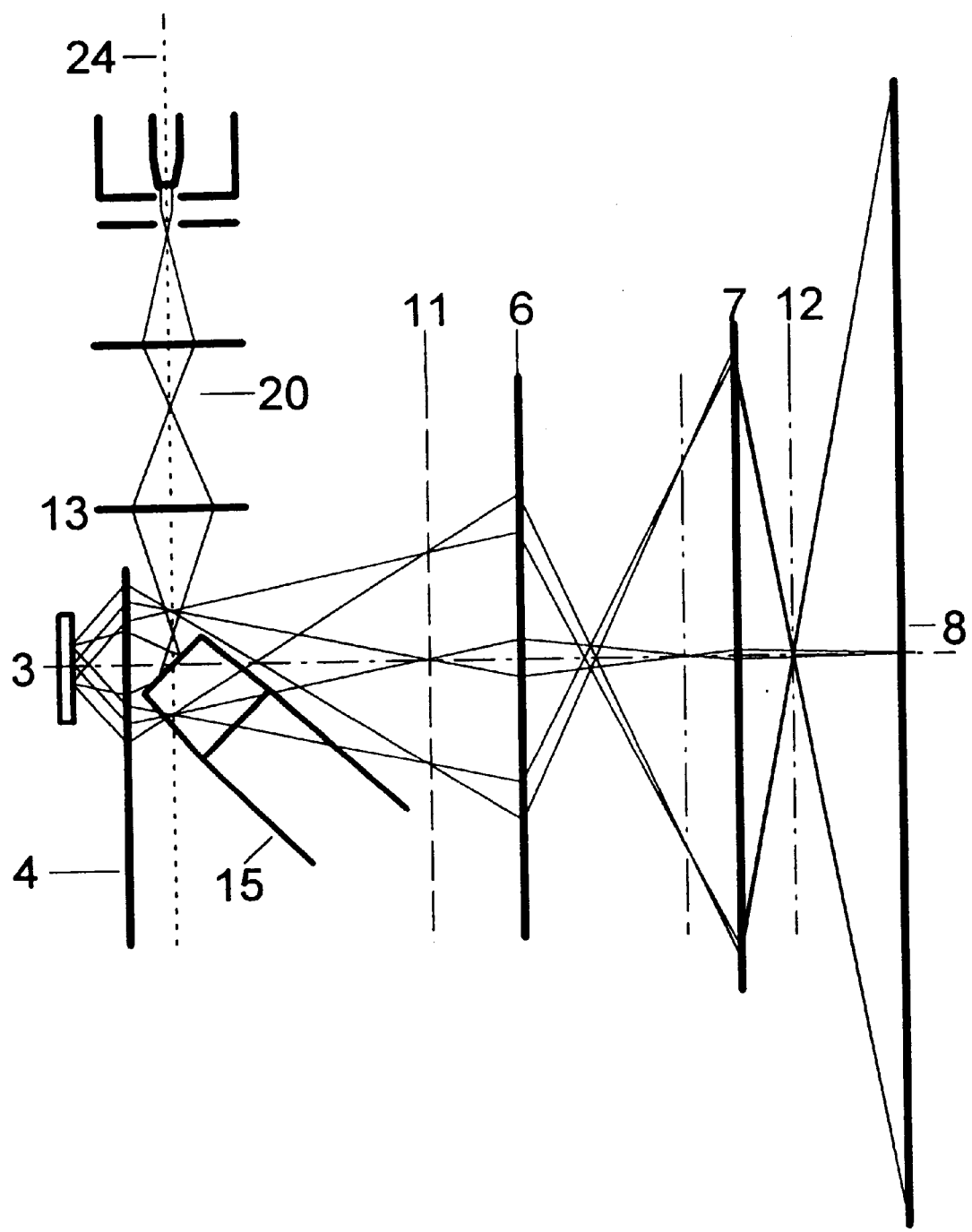

FIGS. 4a–c are schematic drawings of the beam path in the electron microscope.

FIG. 4a depicts the LEED or SPLEED mode; FIG. 4b, the LEEM or SPLEEM mode; and FIG. 4c, the imaging of secondary or Auger electrons.

In both the diffraction mode (LEED/SPLEED) and in imaging the elastic electrons (LEEM/SPLEEM), the electron beam is focused from the lens 13 on the electron reflector 15. The parallel illumination of the surface of the specimen 3 leads then to the production of a LEED image in the rear focal plane 10 of the objective lens 4; the image being enlarged on the phosphor screen 9 by means of the first projector lens 6 (transfer lens) and the second projector lens 7 (FIG. 4a).

To change from LEED mode to direct imaging of the surface of the specimen with diffracted electrons, the excitation of the first projector lens 6 is changed, as illustrated in FIG. 4b. Then the projector lens 7 enlarges the intermediate image, produced in the image plane 11, on the electron multiplier 8 and the phosphor screen 9.

Figure 4D:
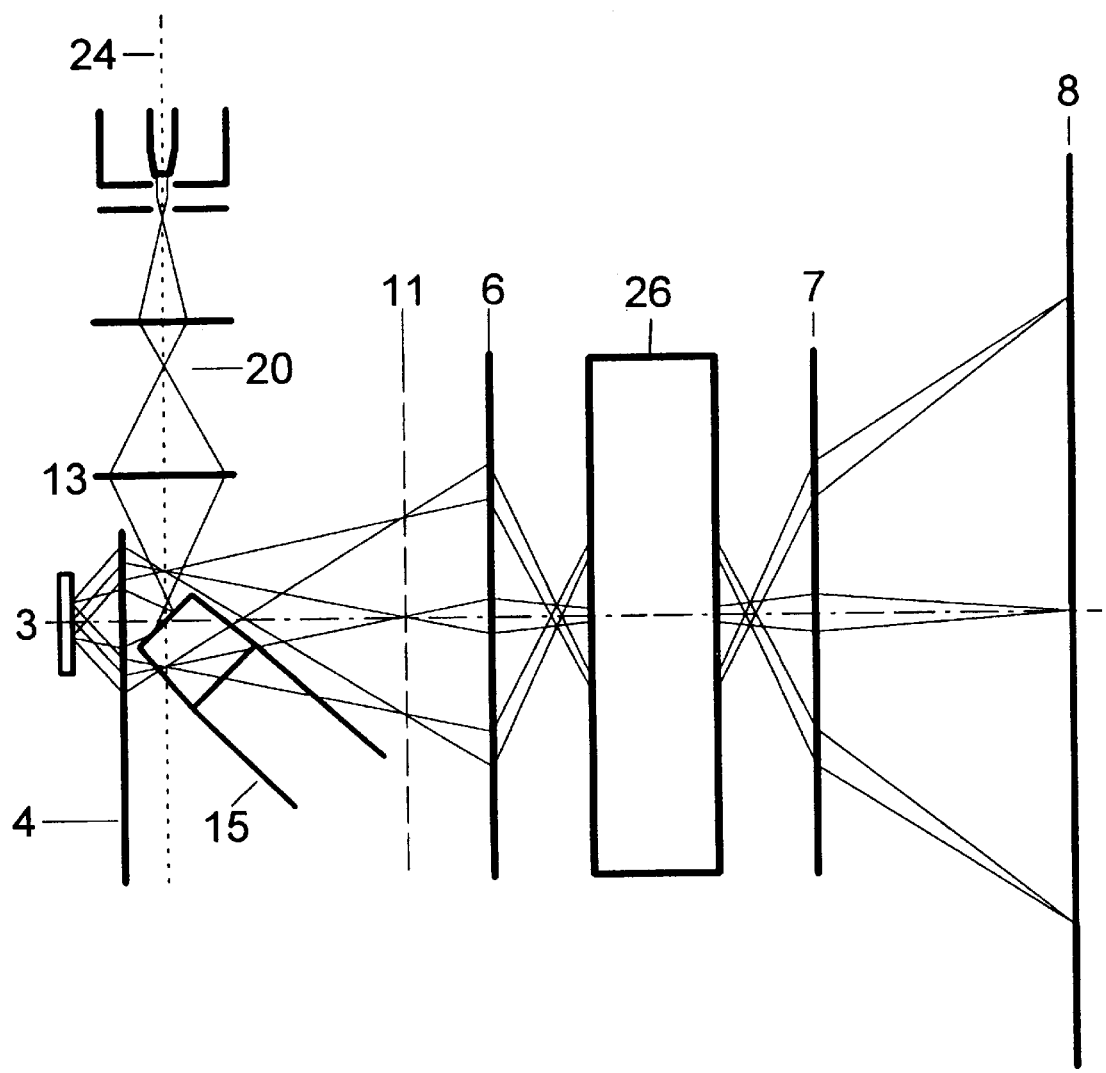

To map with secondary and Auger electrons (see FIG. 4c), the primary beam is not focused on the electron reflector 15 by changing the excitation of Hi the lens 13, but rather in front of the reflector, so that a larger effective surface of the electron reflector can be illuminated. In so doing, the primary beam 20 is focused on the specimen 3 using the objective lens 4, thus increasing the electron density in the visual field. The secondary and Auger electrons are also imaged by means of the projector lenses 6 and 7 on the electron multiplier 8. As shown in FIG. 4d, an energy filter 26 is mounted between projector lenses 6 and 7 in this case.

For background imaging by means of one or more diffraction reflections, a moveable contrast diaphragm for selecting the diffraction reflections may also be provided, in addition to the electron reflector 15, exactly in the focal point 23 in the rear objective focal plane 10 or in the corresponding conjugate plane of the objective lens 4. Since the diffraction pattern under typical operating conditions has a diameter of 2 mm maximum, an exact positioning of the contrast diaphragm is possible by means of, for example, piezo motors without any problems.

Figure 5:
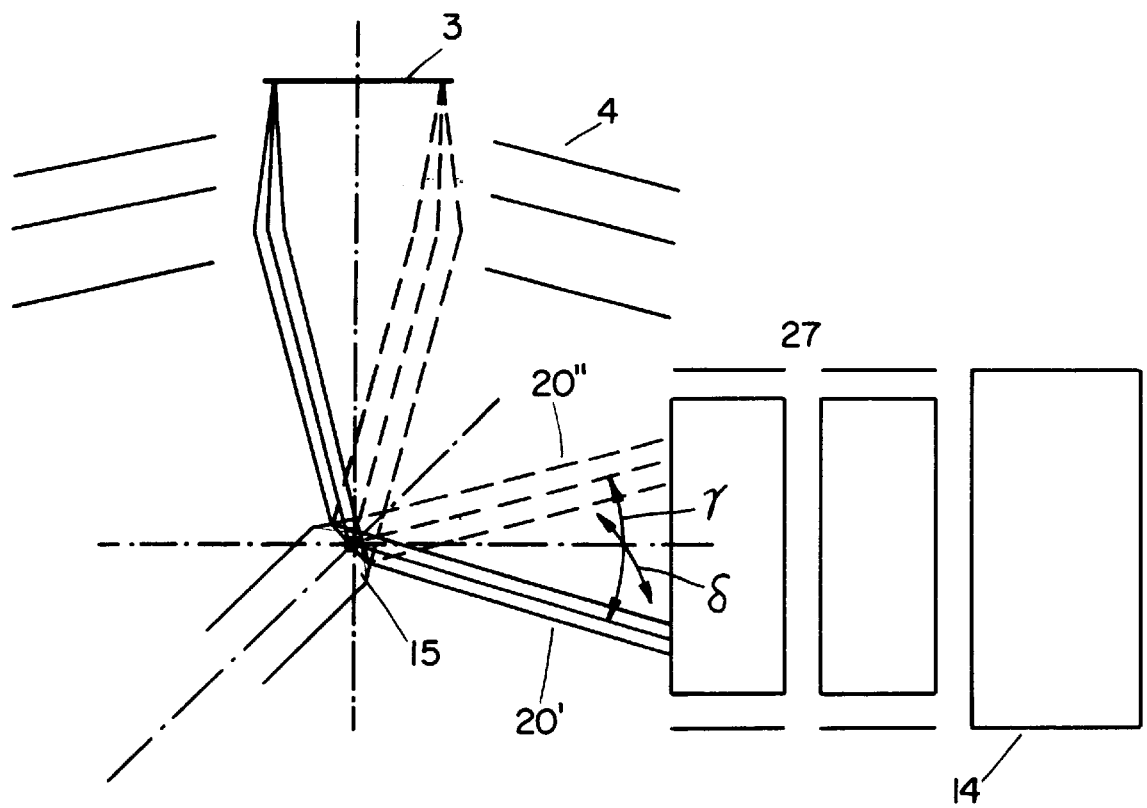
FIG. 5 is an exploded diagram of the reflector-specimen area of the electron microscope according to another embodiment.

FIG. 5 depicts another embodiment, which enables a scanning operation. Between the electron source 14 and the reflector 15 there is an electrostatic deflector 27, which deflects the primary beam in two directions that are orthogonal to each other and are indicated by the angles $\delta$ and $\phi$. The angles $\delta$ and $\phi$ lie in the region of $\pm 1$. The deflection is indicated by the primary beams 20' and 20".

What is claimed is:

1. Electron microscope with an electron source, with an electron optical imaging system, comprising at least one objective lens and one projector lens, and a detector which includes at least one of a phosphor screen and an electron multiplier, wherein at least one electron reflector is mounted in the rear focal plane of the objective lens or in one of its conjugate planes and aligned in such a manner that the primary beam coming from the electron source is focused on a specimen to be analyzed.

2. Electron microscope, as claimed in claim 1, wherein the electron reflector is mounted with its reflector tip in the beam path of the electron optical imaging system.

3. Electron microscope, as claimed in claim 1, wherein the effective surface of the electron reflector is aligned at a 45° angle $\beta$ with respect to an optical axis of the objective lens.

4. Electron microscope, as claimed in claim 1, wherein the electron reflector is swivel-mounted around a focal point of the objective lens.

5. Electron microscope, as claimed in claim 1, wherein the electron source is swivel-mounted around a focal point of the objective lens.

6. Electron microscope, as claimed in claim 1, wherein the electron source is mounted in a rear focal plane of the objective lens or one of its conjugate planes.

7. Electron microscope, as claimed in claim 1, wherein at least one lens is mounted between the electron source and the electron reflector.

8. Electron microscope, as claimed in claim 7, wherein an excitation level of the lens is variable.

9. Electron microscope, as claimed in claim 1, wherein the reflector tip is made of a monocrystal or a polycrystalline material.

10. Electron microscope, as claimed in claim 9, wherein the reflector tip is made of a monocrystal made of one of graphite, $LaB_6$ and $CeB_6$.

11. Electron microscope, as claimed in claim 9, wherein the reflector tip is made of an electron spin-polarizing material.

12. Electron microscope, as claimed in claim 11, wherein the reflector tip is made of a material having a high atomic number.

13. Electron microscope, as claimed in claim 12, wherein the reflector tip is made of gold or platinum.

14. Electron microscope, as claimed in claim 11, wherein the reflector tip is made of one of tungsten and molybdenum.

15. Electron microscope, as claimed in claim 1, wherein the electron reflector includes a heater.

16. Electron microscope, as claimed in claim 1, further comprising a holder provided with a plurality of electron reflectors.

17. Electron microscope, as claimed in claim 16, wherein the plurality of electron reflectors are arranged in a star configuration in the holder and the holder can be rotated.

18. Electron microscope, as claimed in claim 1, further comprising means for scanning the surface of the specimen.

19. Electron microscope, as claimed in claim 18, further comprising an electrostatic deflector for changing the angle of incidence of the primary beam at the reflector in two mutually orthogonal directions, mounted between the electron source and the reflector.

20. Electron microscope, as claimed in claim 18, wherein the reflector includes an adjusting mechanism in order to change the beam reflected at the reflector in two directions that are orthogonal to each other.

\* \* \* \* \*